(12) United States Patent
Iizuka

(10) Patent No.: US 8,625,384 B2
(45) Date of Patent: Jan. 7, 2014

(54) SYNCHRONOUS TYPE SEMICONDUCTOR STORAGE DEVICE AND DRAM

(75) Inventor: Mariko Iizuka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 392 days.

(21) Appl. No.: 13/053,357

(22) Filed: Mar. 22, 2011

(65) Prior Publication Data
US 2012/0106268 A1   May 3, 2012

(30) Foreign Application Priority Data
Oct. 27, 2010  (JP) .................. 2010-241254

(51) Int. Cl.
*G11C 8/00*   (2006.01)

(52) U.S. Cl.
USPC ............ 365/233.1; 365/189.08; 365/189.011; 365/189.15; 365/189.16; 365/233.16; 365/233.17

(58) Field of Classification Search
USPC ............ 365/189.011, 189.15, 189.16, 233.1, 365/233.16, 233.17
See application file for complete search history.

(56) References Cited

U.S. PATENT DOCUMENTS

| | | | | |
|---|---|---|---|---|
| 5,341,341 | A * | 8/1994 | Fukuzo ................... | 365/233.14 |
| 5,659,515 | A * | 8/1997 | Matsuo et al. ............... | 365/222 |
| 5,682,343 | A * | 10/1997 | Tomishima et al. .......... | 365/63 |
| 6,108,229 | A * | 8/2000 | Shau ............................. | 365/52 |
| 6,813,696 | B2 * | 11/2004 | Kanda et al. ................. | 711/167 |
| 6,909,658 | B2 * | 6/2005 | Arimoto et al. .............. | 365/222 |

FOREIGN PATENT DOCUMENTS

JP       2000-105995       11/2000

* cited by examiner

*Primary Examiner* — Thao Bui
(74) *Attorney, Agent, or Firm* — White & Case LLP (57) ABSTRACT

A synchronous type semiconductor storage device includes an array unit which includes a cell array and sense amplifiers. The synchronous type semiconductor storage device includes a read/write pulse generator which generates a read pulse signal and a write pulse signal according to a clock signal, the clock signal defining one cycle time of a read operation and a write operation with respect to the array unit as one cycle. The synchronous type semiconductor storage device includes a secondary amplifier which is activated according to the read pulse signal to read out data stored in the sense amplifiers through the read/write line. The synchronous type semiconductor storage device includes a write driver which is activated according to the write pulse signal to write data in the sense amplifiers through the read/write line.

20 Claims, 8 Drawing Sheets

SYNCHRONOUS TYPE SEMICONDUCTOR STORAGE DEVICE AND DRAM

CROSS-REFERENCE TO RELATED APPLICATION

This application is based upon and claims the benefit of priority from the prior Japanese Patent Application No. 2010-241254, filed on Oct. 27, 2010, the entire contents of which are incorporated herein by reference.

BACKGROUND

1. Field

Embodiments described herein relate generally to a Synchronous type semiconductor storage device and a DRAM.

2. Background Art

Recently, an increasing integration of a memory device tends to lead to an increase in the capacity of an array unit of, for example, a DRAM. Due to such tendency, the capacitance of wirings thereof also increases. Therefore, when a transistor is at the so-called slow corner of the PVT conditions (process parameters, voltage, and temperature), the read/write time of the array unit is deteriorated greatly. In addition, in a highly integrated memory device, a ratio of a read/write time to a cycle time tends to be larger.

On the other hand, although the line and space patterns of the column selection lines and the data lines of the DRAM are scaled, the R/C value of the internal wiring of the array unit is rarely scaled. Therefore, the read/write time is not reduced due to the R/C value of the internal wiring even at the fast corner of the transistor. Accordingly, it is not preferable to decrease the pulse width of the read/write pulse signal of the array unit at the fast corner.

Therefore, the read/write pulse signal may have a large duty ratio with respect to the cycle time defined as one cycle of a clock signal, and it is necessary to suppress the decrease in the pulse width at the fast corner (in other words, it is necessary to suppress the PVT change in the pulse width).

The clock signal as a trigger clock for the read/write pulse signal is input to various circuits. For this reason, it is preferable that the pulse width of the clock signal is controlled independently of the read/write pulse width.

Therefore, conventionally, an edge trigger type pulse generator has been used as a read/write pulse generation circuit. Accordingly, the pulse generator may be compatible with both of the cases: one case where the pulse width of the clock signal is smaller than the read/write pulse width and the other case where the pulse width of the clock signal is larger than the read/write pulse width.

The edge trigger type pulse generator performs a pulse reset operation by using the pulse output as a trigger. In the edge trigger type pulse generator, a reset path for resetting is longer than a path for generating a pulse, and the reset path is a rate-controlling factor at the time of generating the pulse comprising a large duty ratio with respect to the cycle time as described.

In addition, for the speedy reset operation, there is a trend that the size of the transistor used for the reset operation increases. As a result, the number of logic stages in the path for generating the pulse is also increased in order to make it possible for more driving capacity for the reset transistor to be obtained. However, the increase in the number of logic stages acts as a negative factor in suppressing the PVT change in the read/write pulse signal.

DETAILED DESCRIPTION

A synchronous type semiconductor storage device according to an embodiment, includes an array unit which includes a cell array and sense amplifiers, the cell array comprising a plurality of memory cells disposed in a lattice shape, and the sense amplifiers connected to the memory cells through bit lines. The synchronous type semiconductor storage device includes a read/write pulse generator which generates a read pulse signal and a write pulse signal according to a clock signal, the clock signal defining one cycle time of a read operation and a write operation with respect to the array unit as one cycle. The synchronous type semiconductor storage device includes a secondary amplifier which is connected to the sense amplifiers through a read/write line and which is activated according to the read pulse signal to read out data stored in the sense amplifiers through the read/write line. The synchronous type semiconductor storage device includes a write driver which is connected to the sense amplifiers through the read/write line and which is activated according to the write pulse signal to write data in the sense amplifiers through the read/write line.

The read/write pulse generator includes a ½ frequency divider which is input with the clock signal and outputs a first frequency-divided signal formed by ½-dividing a frequency of the clock signal. The read/write pulse generator includes a first inverter which is input with the first frequency-divided signal and outputs a second frequency-divided signal formed by inverting the first frequency-divided signal. The read/write pulse generator includes a first pulse generation circuit which is input with the first frequency-divided signal, and which generates and outputs a first pulse signal based on the first frequency-divided signal. The read/write pulse generator includes a second pulse generation circuit which has the same configuration as that of the first pulse generation circuit, which is input with the second frequency-divided signal, and which generates and outputs a second pulse signal based on the second frequency-divided signal. The read/write pulse generator includes a first OR circuit which is input with the first pulse signal and the second pulse signal, and which outputs the read pulse signal and the write pulse signal.

Hereinafter, although the case where a synchronous type semiconductor storage device is a DRAM is described in the following embodiments, the same description applies in the case of other types of the synchronous type semiconductor storage devices such as SDRAMs. Hereinafter, the embodiments will be described with reference to the drawings.

(First Embodiment)

Figure 1:
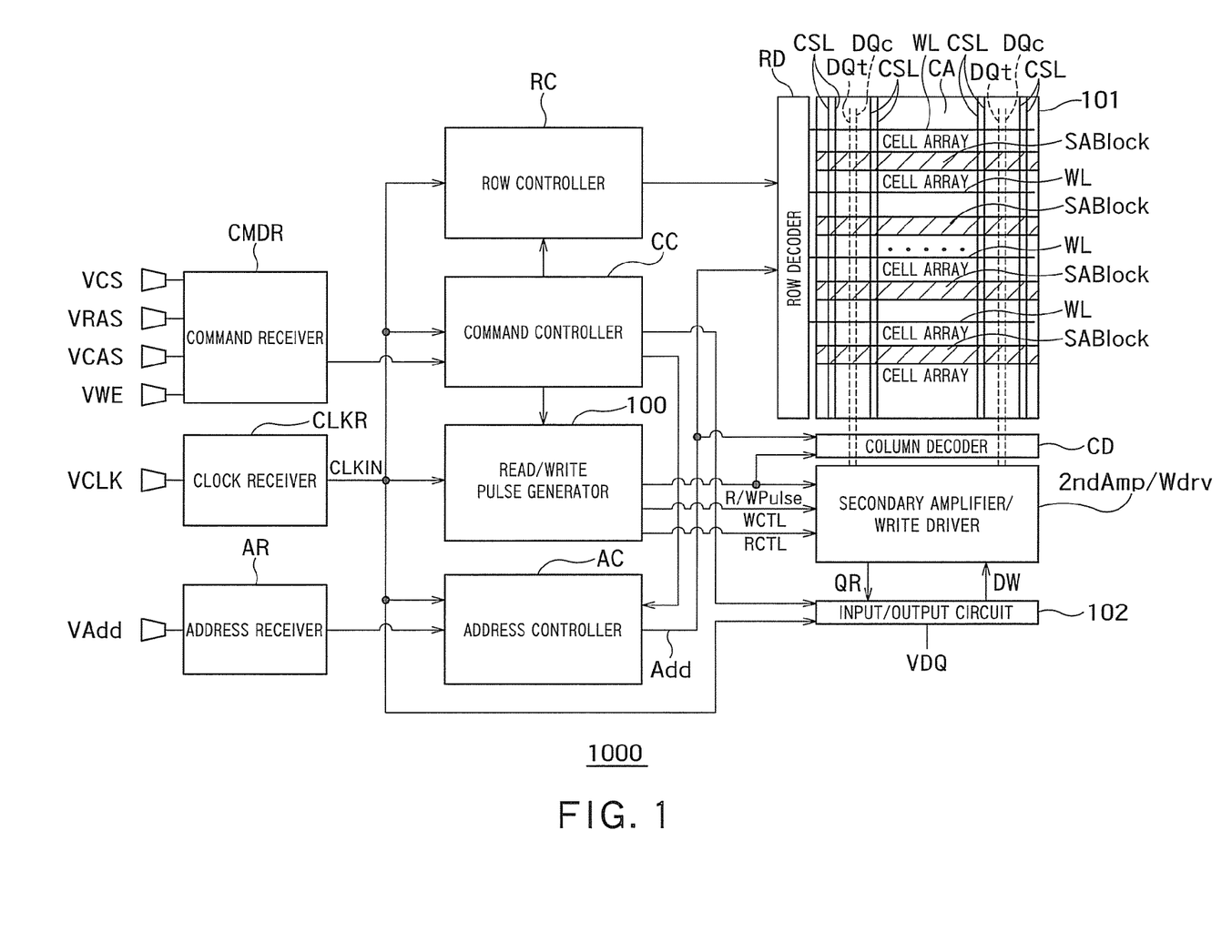
FIG. 1 is a diagram showing an example of a configuration of a synchronous type semiconductor storage device 1000 according to an embodiment of the present invention.
Figure 2:
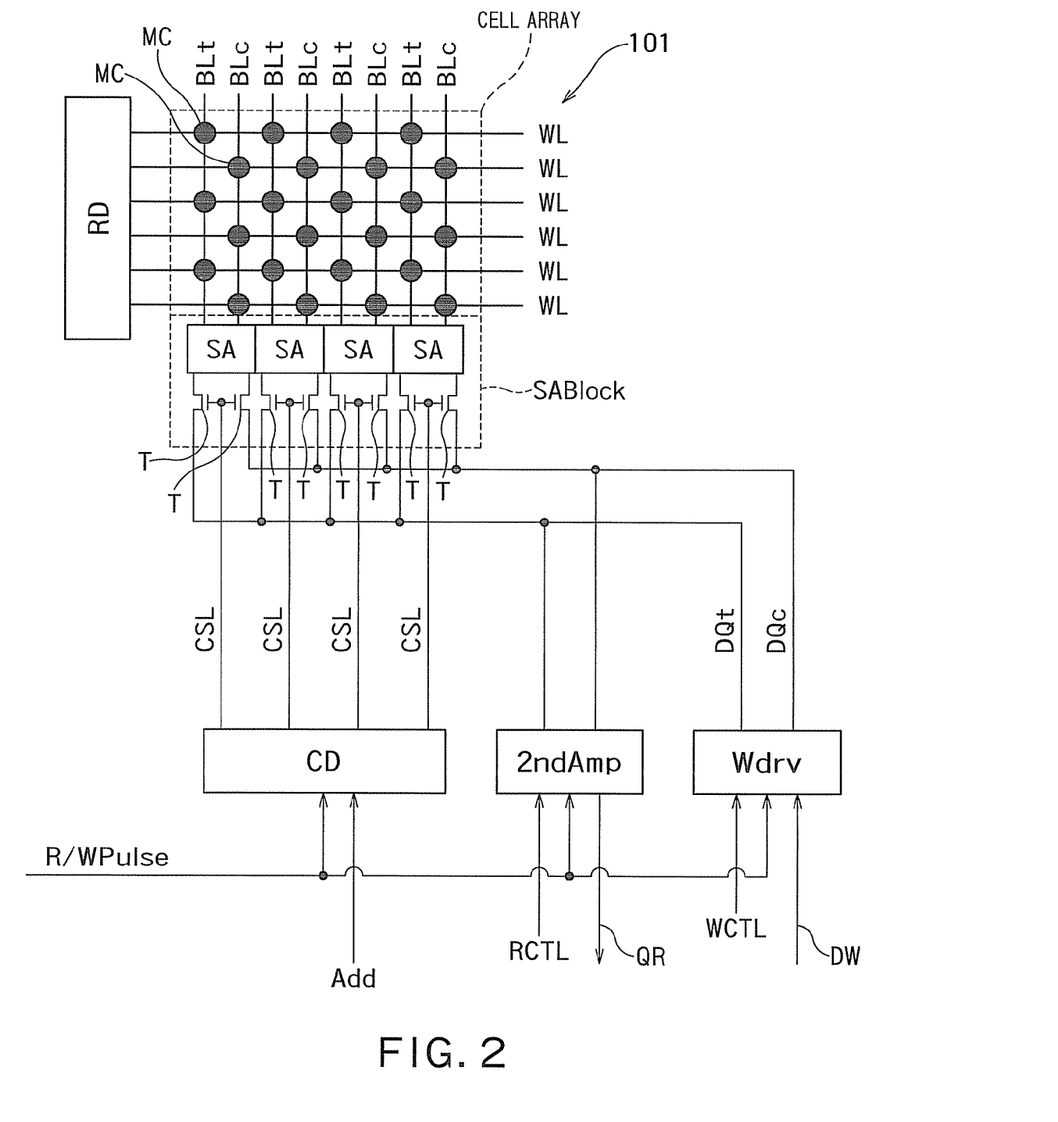
FIG. 2 is a diagram schematically showing an example of a configuration including an array unit 101, a row decoder RD, a column decoder CD, a secondary amplifier 2ndAmp, and a write driver Wdrv of the synchronous type semiconductor storage device 1000 illustrated in FIG. 1.

FIG. 1 is a diagram showing an example of a configuration of a synchronous type semiconductor storage device 1000 according to an embodiment of the present invention. FIG. 2 is a diagram schematically showing an example of a configuration including an array unit 101, a row decoder RD, a column decoder CD, a secondary amplifier 2ndAmp, and a write driver Wdrv of the synchronous type semiconductor storage device 1000 illustrated in FIG. 1.

As illustrated in FIGS. 1, and 2, the synchronous type semiconductor storage device 1000 includes a read/write pulse generator 100, the array unit 101, an input/output circuit 102, a command receiver CMDR, an address receiver AR, a clock receiver CLKR, a row controller RC, a command controller CC, an address controller AC, the row decoder RD, the column decoder CD, the secondary amplifier 2ndAmp, and the write driver Wdrv.

The command receiver CMDR is configured to receive external input commands VCS, VRAS, VCAS, and VWE for controlling operations of the DRAM and to transmit the information (various commands) to the command controller CC.

The command controller CC is configured to decode the external input commands VCS, VRAS, VCAS, and VWE. In addition, the command controller CC is configured to output control signals (various commands) based on the decoded information and to control the address controller AC, the row controller RC, the input/output circuit 102, and the read/write pulse generator 100.

The clock receiver CLKR is configured to receive an external input clock signal VCLK and to output a clock signal CLKIN according to the external clock signal VCLK to the row controller RC, the command controller CC, the read/write pulse generator 100, the address controller AC, and the input/output circuit 102.

The address receiver AR is configured to receive an external input address VADD and to transfer the address information to the address controller AC.

The address controller AC is configured to control the address information received from the address receiver AR and to transmit the address information Add to the row decoder RD and the column decoder CD.

The row controller RC is configured to activate or inactivate a word line WL corresponding to the input address information Add through the row decoder RD in the case where the control signal (command) output by the command controller CC indicates the activation operation for the word line WL and the precharge operation for the word line WL.

The read/write pulse generator 100 is configured to generate a read/write pulse signal R/WPulse (hereinafter, for convenience, this signal may be individually denoted by a read pulse signal RPulse and a write pulse signal WPulse) according to the clock signal CLKIN defining one cycle time of the read operation and the write operation for the array unit 101 as one cycle.

In other words, the read/write pulse generator 100 generates the read/write pulse signal R/WPulse defining a read operation time or a write operation time of the internal portion of the array unit 101 based on the clock signal CLKIN in the case where the control signal (command) output by the command controller CC indicates the read operation or the write operation. An activation time of the column decoder CD, the secondary amplifier 2ndAmp, and the write driver Wdrv is controlled based on the read/write pulse signal R/WPulse.

The input/output circuit 102 is configured to transfer written data input from an external input/output terminal VDQ to the input line DW and to output the read data transferred through an output line QR to the external input/output terminal VDQ according to the clock signal CLKIN and the control signal of the command controller CC.

The array unit 101 is configured to include a cell array where a plurality of memory cells MC are disposed in a lattice shape and a sense amplifier block SABlock which includes a plurality of sense amplifiers SA connected to the memory cells MC through the bit lines BL (FIG. 2). Each of the memory cells MC is connected to the word line WL and the bit line BL. Each word line WL is connected to the row decoder RD, and each bit line BL is connected to the sense amplifier SA.

In addition, in the example of FIG. 2, for simplifying the description, it is exemplified that the number of the sense amplifiers SA selected by one column selection line CSL is one, and the number of the sense amplifiers SA connected to one set of complementary read/write lines DQt and DQc is four. In general, the combination varies depending on the capacity of the memory, the bit width, and the band width.

The column decoder CD is configured to select the sense amplifier SA by the column selection line CSL activated according to the address information Add among the sense amplifier block SABlock corresponding to the word line WL selected by the row decoder RD.

The secondary amplifier 2ndAmp is connected to the sense amplifier SA through the complementary read/write lines DQt and DQc. The secondary amplifier 2ndAmp is configured to be activated according to the read pulse signal Rpulse and to read out the data stored in the sense amplifier SA through the complementary read/write lines DQt and DQc.

For example, the data of the memory cell MC connected to the word line WL selected by the row decoder RD are read out by bit lines BLt and BLc, amplified by the sense amplifier SA, written back to the memory cell MC, and at the same time, stored in the sense amplifier SA.

In addition, at the time of the read operation, the column decoder CD activates the column selection line CSL selected according to the address information Add. The data are read out from the sense amplifier SA connected to a switch T, which is turned on through the activation of the column selection line CSL, to the complementary read/write lines DQt and DQc.

Then, at the time of the read operation, the secondary amplifier 2ndAmp reads out data from the sense amplifier SA selected by the column selection line CSL activated by the column decoder CD in the group of the sense amplifiers corresponding to the word line WL selected by the row decoder RD. Subsequently, the secondary amplifier 2ndAmp amplifies the data. The amplified data are transferred through the output line QR to the input/output circuit 102.

In addition, the write driver Wdrv is connected to the sense amplifier SA through the complementary read/write lines DQt and DQc to be activated according to the write pulse signal WPulse and to write data in the sense amplifier SA through the complementary read/write lines DQt and DQc.

In other words, at the time of the write operation, the write driver Wdrv is configured to latch written data input from the input line DW and to transfer the data to the selected sense amplifier SA through the complementary read/write lines DQt and DQc according to the write control signal WCTL.

In other words, at the time of the write operation, the write driver Wdrv transfers the written data input through the input line DW to the complementary read/write lines DQt and DQc by activating the complementary read/write lines DQt and DQc according to the write control signal WCTL. Next, the data on the complementary read/write lines DQt and DQc are temporarily written in the sense amplifier SA. In addition, the data are written in the memory cell MC through the bit lines BLt and BLc by the sense amplifier SA, so that the data are retained in the memory cell MC after the word line WL selected by the row decoder RD is inactivated.

Next, an example of the operations of the synchronous type semiconductor storage device 1000 comprising the aforementioned configuration will be described.

Figure 3:
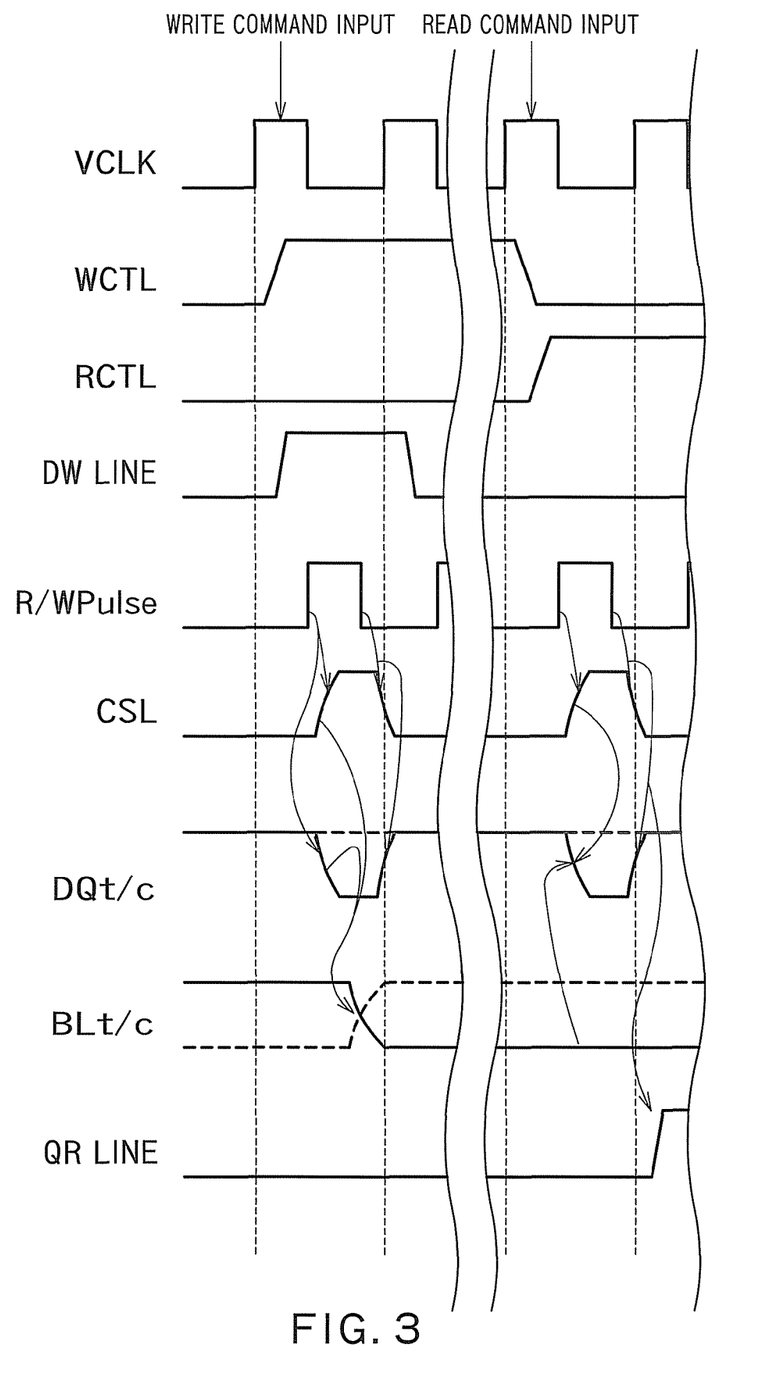
FIG. 3 is a diagram showing an example of waveforms of signals at the time of the read operation and at the time of the write operation of the synchronous type semiconductor storage device 1000 illustrated in FIGS. 1 and 2.

FIG. 3 is a diagram showing an example of waveforms of signals at the time of the read operation and at the time of the write operation of the synchronous type semiconductor storage device 1000 illustrated in FIGS. 1 and 2.

As illustrated in FIG. 3, the read/write pulse generator 100 activates the write driver Wdrv by setting the write control signal WCTL to the "High" level (activation) according to the control signal (write command) from the command controller CC.

Next, since the input line DW is driven as level 1 ("High" level), the write driver Wdrv changes one of the complementary read/write lines DQt and DQc during the time period when the read/write pulse R/WPulse is activated ("High" level).

In addition, according to the activation ("High" level) of the read/write pulse R/WPulse, the column selection line CSL corresponding to the address information Add is activated ("High" level) by the column decoder CD, and the switch T corresponding to the activated column selection line CSL is turned on.

Accordingly, the sense amplifier SA changes the potentials of the bit lines BLt and BLc according to the potentials of the complementary read/write lines DQt and DQc.

If the read/write pulse R/WPulse is inactivated ("Low" level), the column selection line CSL selected by the column decoder C/D is inactivated, and the complementary read/write lines DQt and DQc are equalized to have the same potential by the write driver Wdrv.

On the other hand, the read/write pulse generator 100 activates the secondary amplifier 2ndAmp by setting the read control signal RCTL to the "High" level (activation) according to the control signal (read command) from the command controller CC.

Then, according to the activation ("High" level) of the read/write pulse R/WPulse, the column selection line CSL corresponding to the address information Add is activated ("High" level) by the column decoder CD, and the switch T corresponding to the activated column selection line CSL is turned on.

In general, in this case, at the same time, the equalization of the complementary read/write lines DQt and DQc to the same potential is released by the write driver Wdrv. Therefore, the sense amplifier SA changes the potentials of the complementary read/write lines DQt and DQc according to the potentials stored in the bit lines BLt and BLc.

In addition, the secondary amplifier 2ndAmp changes the potential of the output line QR according to the potentials of the complementary read/write lines DQt and DQc during the time period when the read/write pulse R/WPulse is activated ("High" level).

If the read/write pulse R/WPulse is inactivated ("Low" level), the column selection line CSL selected by the column decoder C/D is inactivated, and the complementary read/write lines DQt and DQc are equalized to have the same potential by the write driver Wdrv.

In this manner, the time of reading out the data from the sense amplifier SA is directly defined by the time of activating the column selection line CSL, that is, the activation time of the read/write pulse signal R/WPulse.

In addition, the time of sensing the data read out to the complementary read/write lines DQt and DQc is controlled by the sensing time of the secondary amplifier 2ndAmp, that is, the read/write pulse signal R/WPulse.

In this manner, in the first embodiment, the time of reading the data from the sense amplifier SA and the time of sensing the data read out to the complementary read/write lines DQt and DQc are controlled by the read/write pulse signal R/WPulse.

The activation operation method for the secondary amplifier 2ndAmp or the write driver Wdrv by the read/write pulse signal R/WPulse is controlled by the read control signal RCTL and the write control signal WCTL.

Figure 4:
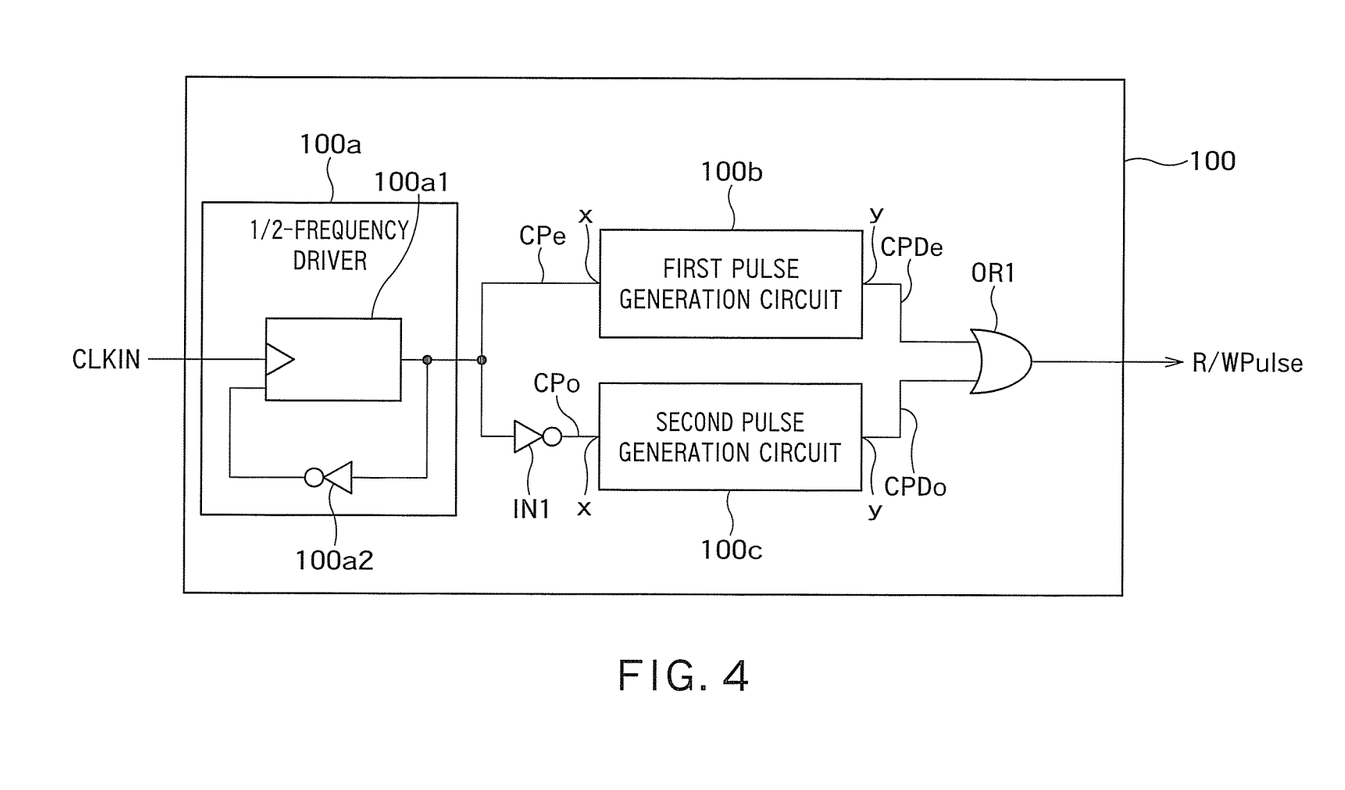
FIG. 4 is a diagram showing an example of a configuration of the read/write pulse generator 100 of the synchronous type semiconductor storage device 1000 illustrated in FIG. 1.

FIG. 4 is a diagram showing an example of a configuration of the read/write pulse generator 100 of the synchronous type semiconductor storage device 1000 illustrated in FIG. 1.

As illustrated in FIG. 4, the read/write pulse generator 100 includes a ½ frequency divider 100a, a first inverter IN1, an edge trigger type first pulse generation circuit 100b, an edge trigger type second pulse generation circuit 100c, and a first OR circuit OR1.

The ½ frequency divider 100a is configured to be input with the clock signal CLKIN and to output a first frequency-divided signal CPe formed by ½-dividing the frequency of the clock signal CLKIN.

The ½ frequency divider 100a includes a flip-flop 100a1 and a frequency dividing inverter 100a2.

The flip-flop 100a1 is configured so that the clock terminal thereof is input with the clock signal CLKIN and the first frequency-divided signal CPe is output from the output terminal thereof.

The frequency dividing inverter 100a2 is configured so that the input thereof is connected to the output terminal of the flip-flop 100a1 and the output thereof is connected to the data terminal of the flip-flop 100a1.

In addition, the first inverter IN1 is configured to be input with the first frequency-divided signal CPe and to output a second frequency-divided signal CPo formed by inverting the first frequency-divided signal CPe.

The first pulse generation circuit 100b is configured to be input with the first frequency-divided signal CPe through an input portion x thereof and to generate a first pulse signal CPDe based on the first frequency-divided signal CPe and output the first pulse signal CPDe through an output portion y thereof.

The second pulse generation circuit 100c is configured to be input with the second frequency-divided signal CPo through the input portion x thereof and to generate a second pulse signal CPDo based on the second frequency-divided signal CPo and output the second pulse signal CPDo through the output portion y thereof. The second pulse generation circuit 100c has the same configuration as that of the first pulse generation circuit 100b.

The first OR circuit OR1 is configured to be input with the first pulse signal CPDe and the second pulse signal CPDo and to perform the OR operation on the input signals and output a signal obtained through the OR operation, that is, the read/write pulse signal R/WPulse.

Herein, an example of a circuit configuration of the first and second pulse generation circuits 100b and 100c of the read/write pulse generator 100 comprising the aforementioned configuration will be described.

Figure 5:
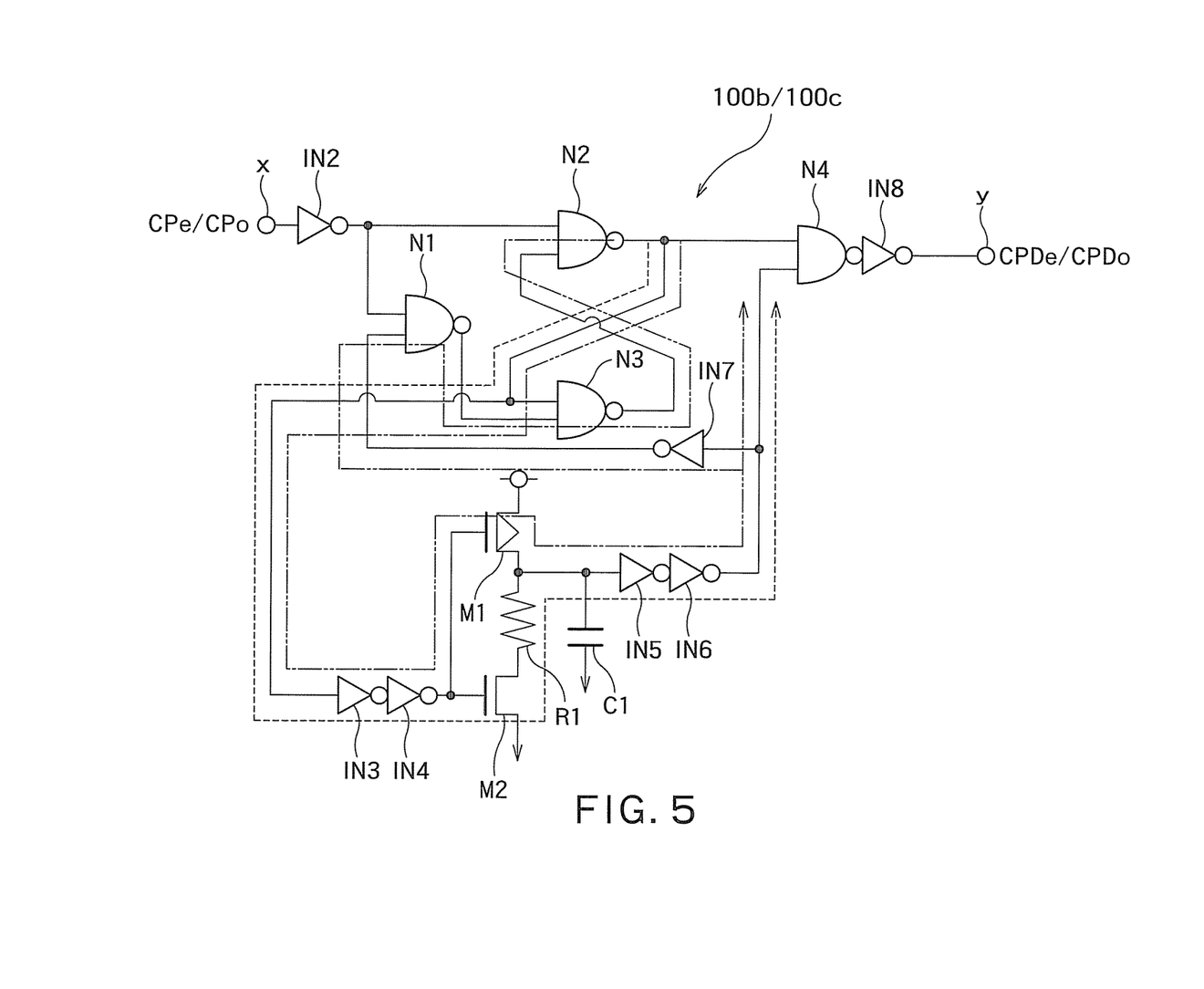
FIG. 5 is a diagram showing an example of the circuit configuration of the first and second pulse generation circuits 100b and 100c illustrated in FIG. 4.

FIG. 5 is a diagram showing an example of the circuit configuration of the first and second pulse generation circuits 100b and 100c illustrated in FIG. 4. In addition, as described above, the first and second pulse generation circuits 100b and 100c have different input and output signals but have the same configuration. Therefore, in FIG. 5, the first and second pulse generation circuits 100b and 100c are illustrated such that input and output signals CPe/CPo and CPDe/CPDo are divided.

As illustrated in FIG. 5, the first pulse generation circuit or the second pulse generation circuit 100b/100c includes a second inverter IN2, a third inverter IN3, a fourth inverter IN4, a fifth inverter IN5, a sixth inverter IN6, a seventh inverter IN7, an eighth inverter IN8, a first NAND circuit N1, a second NAND circuit N2, a third NAND circuit N3, a fourth NAND circuit N4, a pMOS transistor M1, an nMOS transistor M2, a resistor element R1, and a capacitor C1.

The second inverter IN2 is input with the first frequency-divided signal CPe (in the case of the first pulse generation circuit 100b) or the second frequency-divided signal CPo (in the case of the second pulse generation circuit 100c) through the input portion x thereof.

The input of the first NAND circuit N1 is connected to the output of the second inverter IN2.

The input of the second NAND circuit N2 is connected to the output of the second inverter IN2.

The input of the third NAND circuit N3 is connected to the output of the first NAND circuit N1 and the output of the second NAND circuit N2, and the output of the third NAND circuit N3 is connected to the input of the second NAND circuit N2.

The input of the third inverter IN3 is connected to the output of the second NAND circuit N2.

The input of the fourth inverter IN4 is connected to the output of the third inverter IN3.

The source of the pMOS transistor M1 is connected to a power supply, and the gate of the pMOS transistor M1 is connected to the output of the fourth inverter IN4.

The one end of the resistor element R1 is connected to a drain of the pMOS transistor M1.

The nMOS transistor M2 is connected between the other end of the resistor element R1 and a ground, and the gate of the nMOS transistor M2 is connected to the output of the fourth inverter IN4.

The capacitor C1 is connected between the drain of the pMOS transistor M1 and the ground.

The input of the fifth inverter IN5 is connected to the drain of the pMOS transistor M1.

The input of the sixth inverter IN6 is connected to the output of the fifth inverter IN5.

The input of the seventh inverter IN7 is connected to the output of the sixth inverter IN6, and the output of the seventh inverter IN7 is connected to the input of the first NAND circuit N1.

The input of the fourth NAND circuit N4 is connected to the output of the second NAND circuit N2 and the output of the sixth inverter IN6.

The input of the eighth inverter IN8 is connected to the output of the fourth NAND circuit N4 so as to output the first pulse signal CPDe or the second pulse signal CPDo through the output portion y thereof.

Herein, an example of the operations of the read/write pulse generator 100 comprising the aforementioned configuration will be described.

Figure 6:
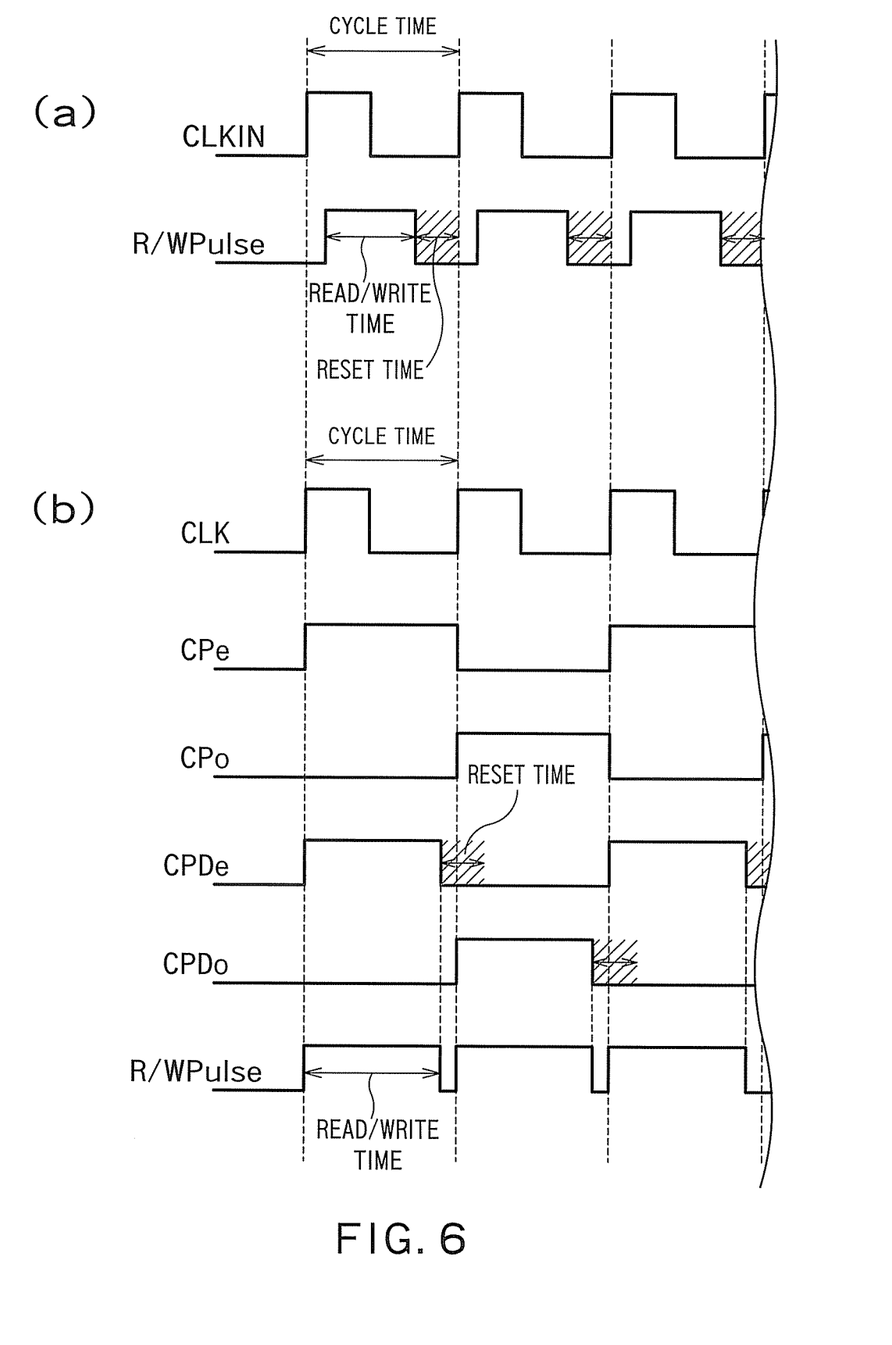
FIG. 6 is a diagram showing an example of waveforms of the operations of the read/write pulse generator 100 illustrated in FIG. 4, and an example of waveforms of the operations of an edge trigger type read/write pulse generator as a comparative example.

FIGS. 6A and 6B are diagrams showing an example of waveforms of the operations of the read/write pulse generator 100 illustrated in FIG. 4, and an example of waveforms of the operations of an edge trigger type read/write pulse generator as a comparative example.

In addition, in FIGS. 6A and 6B, with respect to the relationship among the cycle time, the read/write time, and the reset time of the read/write pulse generator defined by using one cycle of the clock signal CLKIN, the comparative example and the first embodiment are separately illustrated in FIGS. 6A and 6B, respectively.

As illustrated in FIG. 6A, in the comparative example, since the read/write pulse generator is of the edge trigger type, the read/write pulse signal R/WPulse needs to be activated for every cycle.

Therefore, the sum of the read/write time defined by the pulse width of the read/write pulse signal R/WPulse and the reset time needs to be equal to or smaller than the cycle time.

In other words, the pulse width of the read/write pulse signal R/WPulse is limited by the reset time of the edge trigger type read/write pulse generator.

On the other hand, as illustrated in FIG. 6B, in the read/write pulse generator 100 in the first embodiment, the read/write pulse signal R/WPulse is generated from the first and second frequency-divided signals CPe and CPo comprising opposite phases that are twice the frequency of the clock signal CLKIN.

Therefore, the sum of the read/write time and the reset time is equal to or smaller than twice the cycle time.

In other words, the read/write time can be determined without limitation by the reset time of the first and second pulse generation circuits 100b and 100c of the read/write pulse generator 100.

Therefore, it is possible to increase the read/write time with respect to the array unit within the cycle time defined by the clock signal.

The case of using the synchronous type semiconductor storage device 1000 illustrated in FIG. 1 where the column selection control pulse signal CSLPulse, the read pulse signal RPulse, and the write pulse signal WPulse are commonly used has been described above.

Figure 7:
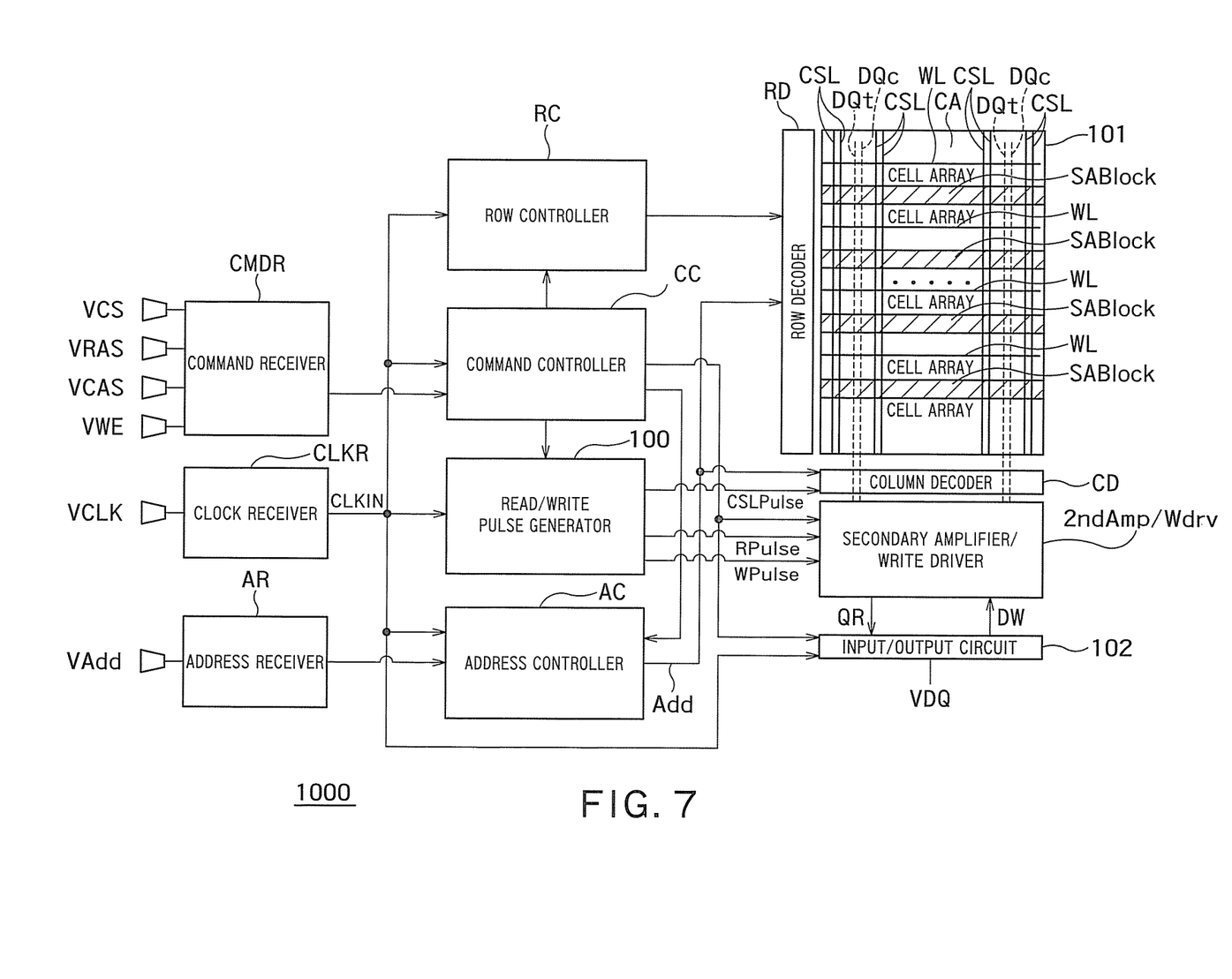
FIG. 7 is a diagram showing another example of a configuration the synchronous type semiconductor storage device 1000 according to the embodiment.

FIG. 7 is a diagram showing another example of a configuration the synchronous type semiconductor storage device 1000 according to the embodiment.

As illustrated in FIG. 7, the read/write pulse generator 100 separately generates and supplies the column selection line (CSL) control pulse CSLPulse, the read pulse RPulse, and the write pulse WPulse.

Except for the signals output from the read/write pulse generator 100, the synchronous type semiconductor storage device 1000 illustrated in FIG. 7 has the same configuration as that of the synchronous type semiconductor storage device 1000 illustrated in FIG. 1.

As illustrated in FIG. 7, the column selection line control signal CSLPulse and the read pulse signal RPulse controlling the secondary amplifier 2ndAmp may be supplied through separate wirings.

In addition, at the time of the write operation, the time of writing the data in the sense amplifier SA is defined by the activation time of the column selection line CSL (that is, the activation time of the read/write pulse signal R/WPulse) and the driving time of the complementary read/write lines DQt and DQc driven by the write driver Wdrv.

The driving time of the complementary read/write lines DQt and DQc driven by the write driver Wdrv is also defined by the read/write pulse signal R/WPulse.

At the time of the write operation, the column selection line control signal CSLPulse and the write control signal WPulse may be supplied through separate wirings. Therefore, the control methods thereof may be considered to be basically the same.

In other words, the control methods in the synchronous type semiconductor storage devices 1000 in FIGS. 1 and 7 may be considered to be basically the same. Therefore, the case of the synchronous type semiconductor storage device 1000 illustrated in FIG. 7 is described to be the same as the case illustrated in FIG. 1.

As described above, according to the synchronous type semiconductor storage device according to the first embodiment, it is possible to increase the read/write time within one cycle of the clock signal defining the read/write cycle time with respect to the array unit.

(Second Embodiment)

In a second embodiment, a configuration where an edge trigger type pulse generation circuit (for example, refer to FIG. 5) is not used in the read/write pulse generator 100 will be described. In addition, except for the read/write pulse generator 100, other configurations are the same as those of the synchronous type semiconductor storage device 1000 illustrated in FIGS. 1 and 2.

Figure 8:
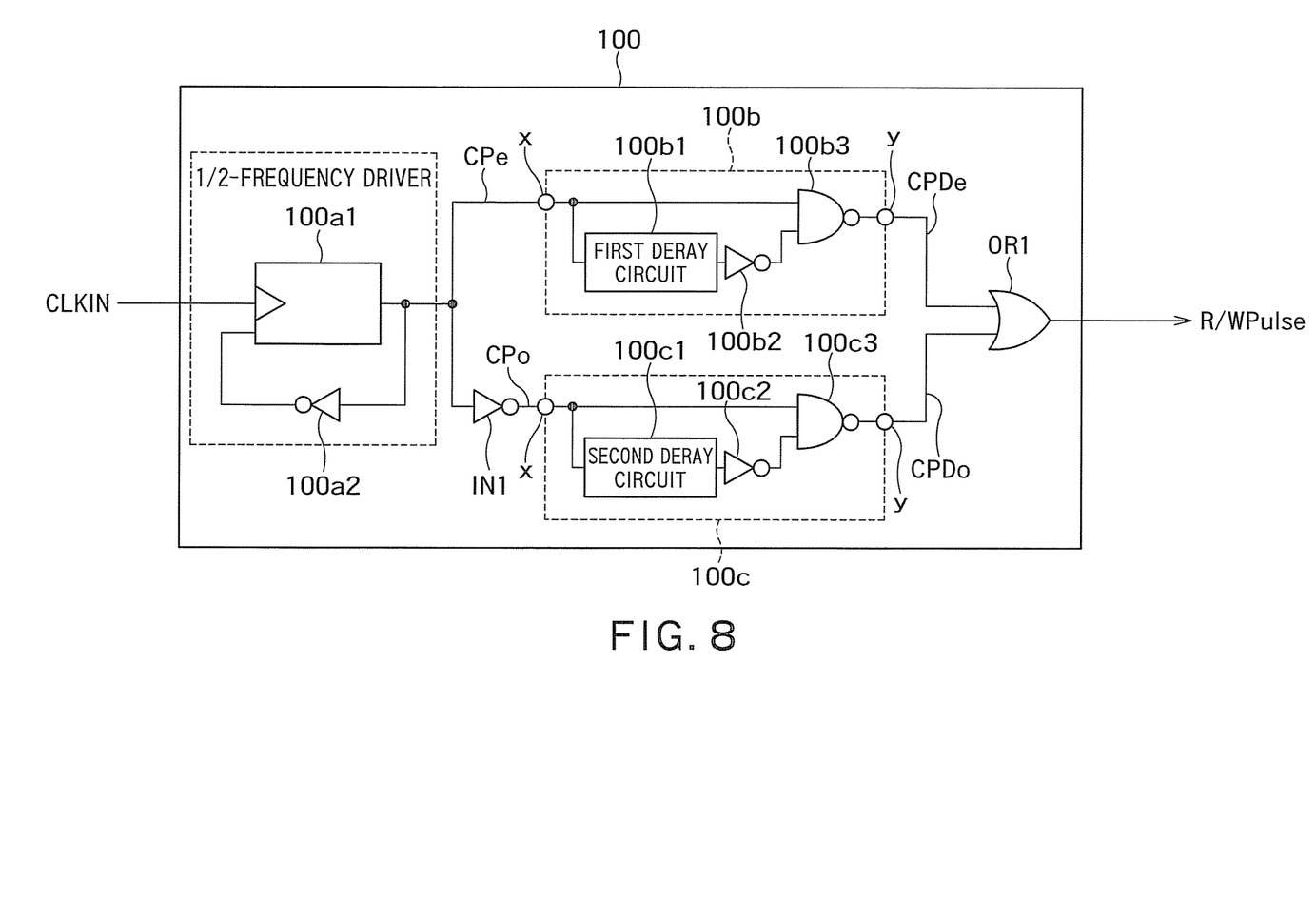
FIG. 8 is a diagram showing another example of a configuration of the read/write pulse generator 100 of the synchronous type semiconductor storage device 1000 illustrated in FIG. 1.

FIG. 8 is a diagram showing another example of a configuration of the read/write pulse generator 100 of the synchronous type semiconductor storage device 1000 illustrated in FIG. 1.

As illustrated in FIG. 8, the read/write pulse generator 100 includes a ½ frequency divider 100a, a first inverter IN1, a first pulse generation circuit 100b, a second pulse generation circuit 100c, and a first OR circuit OR1. In addition, as described above, the first pulse generation circuit 100b and the second pulse generation circuit 100c are not an edge trigger type. Other configurations of the first pulse generation circuit 100b and the second pulse generation circuit 100c in the read/write pulse generator 100 are the same as those of the first embodiment.

Herein, as illustrated in FIG. 8, the first pulse generation circuit 100b includes a first delay circuit 100b1, a first pulse generating inverter 100b2, and a first pulse generating NAND circuit 100b3.

The first delay circuit 100b1 is configured to be input with the first frequency-divided signal CPe through the input portion x thereof and to output a first delay signal formed by delaying the first frequency-divided signal CPe.

The first pulse generating inverter 100b2 is configured to be input with the first delay signal and to output a signal formed by inverting the first delay signal.

The first pulse generating NAND circuit 100b3 is configured to be input with the first frequency-divided signal and the output signal of the first pulse generating inverter 100b2 and to output the first pulse signal CPDe through the output portion y thereof.

In addition, as illustrated in FIG. 8, the second pulse generation circuit 100c includes a second delay circuit 100c1, a second pulse generating inverter 100c2, and a second pulse generating NAND circuit 100c3.

The second delay circuit 100c1 is configured to be input with the second frequency-divided signal CPo through the input portion x thereof and to output a second delay signal formed by delaying the second frequency-divided signal CPo.

In addition, the delay time of the first delay circuit 100b1 is set so as to be the same as the delay time of the second delay circuit 100c1.

The second pulse generating inverter 100c2 is configured to be input with the second delay signal and to output a signal formed by inverting the second delay signal.

The second pulse generating NAND circuit 100c3 is configured to be input with the second frequency-divided signal CPo and the output signal of the second pulse generating inverter 100c2 and to output the second pulse signal CPDo through the output portion y thereof.

According to this configuration, it is possible to reduce the number of logic stages included in the delay circuit which determines the pulse width, making it possible to easily suppress PVT dependency of the pulse width.

In addition, the operations of the read/write pulse generator 100 comprising the aforementioned configuration are the same as, for instance, those in the example of the waveforms of the operations of the read/write pulse generator 100 according to the first embodiment illustrated in FIG. 6.

In other words, although the trigger type pulse generation circuit is not used, the activation time of the first and second frequency-divided signals CPe and CPo becomes one cycle time, and the pulse width of the read/write pulse signal R/WPulse generated in each cycle time can be necessarily increased.

Therefore, it is possible to increase the read/write time within one cycle of the clock signal defining the read/write cycle time with respect to the array unit.

As described above, according to the synchronous type semiconductor storage device according to the second embodiment of the present invention, as described in the first embodiment, it is possible to increase the read/write time within one cycle of the clock signal defining the read/write cycle time with respect to the array unit.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A synchronous type semiconductor storage device comprising:
    an array unit which includes a cell array and sense amplifiers, the cell array comprising a plurality of memory cells disposed in a lattice shape, and the sense amplifiers connected to the memory cells through bit lines;
    a read/write pulse generator which generates a read pulse signal and a write pulse signal according to a clock signal, the clock signal defining one cycle time of a read operation and a write operation with respect to the array unit as one cycle;
    a secondary amplifier which is connected to the sense amplifiers through a read/write line and which is activated according to the read pulse signal to read out data stored in the sense amplifiers through the read/write line; and a write driver which is connected to the sense amplifiers through the read/write line and which is activated according to the write pulse signal to write data in the sense amplifiers through the read/write line, wherein the read/write pulse generator includes:

a ½ frequency divider which is input with the clock signal and outputs a first frequency-divided signal formed by ½-dividing a frequency of the clock signal;

a first inverter which is input with the first frequency-divided signal and outputs a second frequency-divided signal formed by inverting the first frequency-divided signal;

a first pulse generation circuit which is input with the first frequency-divided signal, and which generates and outputs a first pulse signal based on the first frequency-divided signal;

a second pulse generation circuit which has the same configuration as that of the first pulse generation circuit, which is input with the second frequency-divided signal, and which generates and outputs a second pulse signal based on the second frequency-divided signal; and a first OR circuit which is input with the first pulse signal and the second pulse signal, and which outputs the read pulse signal and the write pulse signal.

2. The synchronous type semiconductor storage device of claim 1, wherein the first pulse generation circuit comprising:

a second inverter which is input with the first frequency-divided signal or the second frequency-divided signal;

a first NAND circuit comprising an input connected to the output of the second inverter;

a second NAND circuit comprising an input connected to the output of the second inverter;

a third NAND circuit comprising an input connected to the output of the first NAND circuit and the output of the second NAND circuit, and comprising an output connected to the input of the second NAND circuit;

a third inverter comprising an input connected to the output of the second NAND circuit;

a fourth inverter comprising an input connected to the output of the third inverter;

a pMOS transistor comprising a source connected to a power supply, and comprising a gate connected to the output of the fourth inverter;

a resistor element comprising a first end connected to a drain of the pMOS transistor;

an nMOS transistor connected between a second end of the resistor element and a ground, and comprising a gate connected to the output of the fourth inverter;

a capacitor connected between a drain of the pMOS transistor and the ground;

a fifth inverter comprising an input connected to the drain of the pMOS transistor;

a sixth inverter comprising an input connected to an output of the fifth inverter;

a seventh inverter comprising an input connected to an output of the sixth inverter, and comprising an output connected to the input of the first NAND circuit;

a fourth NAND circuit comprising an input connected to the output of the second NAND circuit and the output of the sixth inverter; and an eighth inverter comprising an input connected to an output of the fourth NAND circuit, and outputting the first pulse signal or the second pulse signal.

3. The synchronous type semiconductor storage device of claim 1, wherein the second pulse generation circuit comprising:

a second inverter which is input with the first frequency-divided signal or the second frequency-divided signal;

a first NAND circuit comprising an input connected to the output of the second inverter;

a second NAND circuit comprising an input connected to the output of the second inverter;

a third NAND circuit comprising an input connected to the output of the first NAND circuit and the output of the second NAND circuit, and comprising an output connected to the input of the second NAND circuit;

a third inverter comprising an input connected to the output of the second NAND circuit;

a fourth inverter comprising an input connected to the output of the third inverter;

a pMOS transistor comprising a source connected to a power supply, and comprising a gate connected to the output of the fourth inverter;

a resistor element comprising a first end connected to a drain of the pMOS transistor;

an nMOS transistor connected between a second end of the resistor element and a ground, and comprising a gate connected to the output of the fourth inverter;

a capacitor connected between a drain of the pMOS transistor and the ground;

a fifth inverter comprising an input connected to the drain of the pMOS transistor;

a sixth inverter comprising an input connected to an output of the fifth inverter;

a seventh inverter comprising an input connected to an output of the sixth inverter, and comprising an output connected to the input of the first NAND circuit;

a fourth NAND circuit comprising an input connected to the output of the second NAND circuit and the output of the sixth inverter; and an eighth inverter comprising an input connected to an output of the fourth NAND circuit, and outputting the first pulse signal or the second pulse signal.

4. The synchronous type semiconductor storage device of claim 1, wherein the first pulse generation circuit comprising:

a first delay circuit which is configured to be input with the first frequency-divided signal and to output a first delay signal formed by delaying the first frequency-divided signal;

a first pulse generating inverter which is configured to be input with the first delay signal and to output a signal formed by inverting the first delay signal; and a first pulse generating NAND circuit which is configured to be input with the first frequency-divided signal and an output signal of the first pulse generating inverter, and which is configured to output the first pulse signal.

5. The synchronous type semiconductor storage device of claim 1, wherein the second pulse generation circuit comprising:

a second delay circuit which is configured to be input with the second frequency-divided signal and to output a second delay signal formed by delaying the second frequency-divided signal;

a second pulse generating inverter which is configured to be input with the second delay signal and to output a signal formed by inverting the second delay signal; and a second pulse generating NAND circuit which is configured to be input with the second frequency-divided signal and an output signal of the second pulse generating inverter, and which is configured to output the second pulse signal.

6. The synchronous type semiconductor storage device of claim 1, wherein the first pulse generation circuit comprising:
a first delay circuit which is configured to be input with the first frequency-divided signal and to output a first delay signal formed by delaying the first frequency-divided signal;
a first pulse generating inverter which is configured to be input with the first delay signal and to output a signal formed by inverting the first delay signal; and
a first pulse generating NAND circuit which is configured to be input with the first frequency-divided signal and an output signal of the first pulse generating inverter, and which is configured to output the first pulse signal, and
wherein the second pulse generation circuit comprising:
a second delay circuit which is configured to be input with the second frequency-divided signal and to output a second delay signal formed by delaying the second frequency-divided signal;
a second pulse generating inverter which is configured to be input with the second delay signal and to output a signal formed by inverting the second delay signal; and
a second pulse generating NAND circuit which is configured to be input with the second frequency-divided signal and an output signal of the second pulse generating inverter, and which is configured to output the second pulse signal.

7. The synchronous type semiconductor storage device of claim 6, wherein a delay time of the first delay circuit is equal to a delay time of the second delay circuit.

8. The synchronous type semiconductor storage device of claim 1, wherein the ½ frequency divider comprising:
a flip-flop comprising a clock terminal input with the clock signal, and outputting the first frequency-divided signal from an output terminal thereof; and
a frequency dividing inverter comprising an input connected to the output terminal of the flip-flop, and comprising an output connected to an data terminal of the flip-flop.

9. The synchronous type semiconductor storage device of claim 2, wherein the ½ frequency divider comprising:
a flip-flop comprising a clock terminal input with the clock signal, and outputting the first frequency-divided signal from an output terminal thereof; and
a frequency dividing inverter comprising an input connected to the output terminal of the flip-flop, and comprising an output connected to an data terminal of the flip-flop.

10. The synchronous type semiconductor storage device of claim 3, wherein the ½ frequency divider comprising:
a flip-flop comprising a clock terminal input with the clock signal, and outputting the first frequency-divided signal from an output terminal thereof; and
a frequency dividing inverter comprising an input connected to the output terminal of the flip-flop, and comprising an output connected to an data terminal of the flip-flop.

11. The synchronous type semiconductor storage device of claim 4, wherein the ½ frequency divider comprising:
a flip-flop comprising a clock terminal input with the clock signal, and outputting the first frequency-divided signal from an output terminal thereof; and
a frequency dividing inverter comprising an input connected to the output terminal of the flip-flop, and comprising an output connected to an data terminal of the flip-flop.

12. The synchronous type semiconductor storage device of claim 5, wherein the ½ frequency divider comprising:
a flip-flop comprising a clock terminal input with the clock signal, and outputting the first frequency-divided signal from an output terminal thereof; and
a frequency dividing inverter comprising an input connected to the output terminal of the flip-flop, and comprising an output connected to an data terminal of the flip-flop.

13. The synchronous type semiconductor storage device of claim 6, wherein the ½ frequency divider comprising:
a flip-flop comprising a clock terminal input with the clock signal, and outputting the first frequency-divided signal from an output terminal thereof; and
a frequency dividing inverter comprising an input connected to the output terminal of the flip-flop, and comprising an output connected to an data terminal of the flip-flop.

14. The synchronous type semiconductor storage device of claim 7, wherein the ½ frequency divider comprising:
a flip-flop comprising a clock terminal input with the clock signal, and outputting the first frequency-divided signal from an output terminal thereof; and
a frequency dividing inverter comprising an input connected to the output terminal of the flip-flop, and comprising an output connected to an data terminal of the flip-flop.

15. The synchronous type semiconductor storage device of claim 1, wherein the synchronous type semiconductor storage device is a DRAM.

16. The synchronous type semiconductor storage device of claim 2, wherein the synchronous type semiconductor storage device is a DRAM.

17. The synchronous type semiconductor storage device of claim 1, wherein the synchronous type semiconductor storage device is a SDRAM.

18. The synchronous type semiconductor storage device of claim 2, wherein the synchronous type semiconductor storage device is a SDRAM.

19. A synchronous type semiconductor storage device comprising:
an array unit which includes a cell array and sense amplifiers, the cell array comprising a plurality of memory cells disposed in a lattice shape, and the sense amplifiers connected to the memory cells through bit lines;
a read/write pulse generator which generates a read pulse signal and a write pulse signal according to a clock signal, the clock signal defining one cycle time of a read operation and a write operation with respect to the array unit as one cycle;
a secondary amplifier which is connected to the sense amplifiers through a read/write line and which is activated according to the read pulse signal to read out data stored in the sense amplifiers through the read/write line; and
a write driver which is connected to the sense amplifiers through the read/write line and which is activated according to the write pulse signal to write data in the sense amplifiers through the read/write line.

20. A DRAM comprising:
an array unit which includes a cell array and sense amplifiers, the cell array comprising a plurality of memory cells disposed in a lattice shape, and the sense amplifiers connected to the memory cells through bit lines;
a read/write pulse generator which generates a read pulse signal and a write pulse signal according to a clock signal, the clock signal defining one cycle time of a read operation and a write operation with respect to the array unit as one cycle;

a secondary amplifier which is connected to the sense amplifiers through a read/write line and which is activated according to the read pulse signal to read out data stored in the sense amplifiers through the read/write line; and a write driver which is connected to the sense amplifiers through the read/write line and which is activated according to the write pulse signal to write data in the sense amplifiers through the read/write line.

* * * * *